United States Patent [19]

Hanagasaki

[11] Patent Number: 5,304,502
[45] Date of Patent: Apr. 19, 1994

[54] PROCESS OF FABRICATING SEMICONDUCTOR INTEGRATED CIRCUIT HAVING CONDUCTIVE STRIPS USED AS RESISTOR AND GATE ELECTRODE OF COMPONENT TRANSISTOR

[75] Inventor: Osamu Hanagasaki, Shizuoka, Japan

[73] Assignee: Yamaha Corporation, Hamamatsu, Japan

[21] Appl. No.: 887,657

[22] Filed: May 26, 1992

Related U.S. Application Data

[63] Continuation of Ser. No. 441,911, Nov. 28, 1989, abandoned.

[30] Foreign Application Priority Data

Nov. 8, 1988 [JP] Japan .................. 63-281987

[51] Int. Cl.$^5$ .................................. H01C 21/266
[52] U.S. Cl. .................................. 437/41; 437/46; 437/47; 437/57; 437/69; 437/918
[58] Field of Search .................. 437/41, 44, 46, 47, 437/57, 59, 60, 69, 918; 148/DIG. 136

[56] References Cited

U.S. PATENT DOCUMENTS

| | | | |
|---|---|---|---|
| 3,865,649 | 2/1975 | Beasom | 148/187 |
| 4,057,894 | 11/1977 | Khajezadeh et al. | 29/577 |
| 4,208,781 | 6/1980 | Rao et al. | 437/918 |
| 4,212,083 | 7/1980 | Rao | 365/154 |
| 4,246,692 | 1/1981 | Rao | 29/571 |
| 4,256,515 | 3/1981 | Miles et al. | 148/1.5 |
| 4,291,328 | 9/1981 | Lien et al. | 357/59 |
| 4,367,580 | 1/1983 | Guterman | 437/918 |
| 4,370,798 | 2/1983 | Lien et al. | 29/576 |
| 4,391,650 | 7/1983 | Pfeifer et al. | 437/47 |
| 4,408,385 | 10/1983 | Rao et al. | 437/918 |
| 4,416,049 | 11/1983 | McElroy | 29/571 |
| 4,455,737 | 6/1984 | Godejahn, Jr. | 29/571 |
| 4,560,583 | 12/1985 | Moksvold | 437/918 |
| 4,599,789 | 7/1986 | Gasner | 437/41 |
| 4,734,382 | 3/1988 | Krishna | 437/47 |
| 4,759,836 | 7/1988 | Hill et al. | 437/918 |
| 4,871,688 | 10/1989 | Lowrey | 437/47 |

FOREIGN PATENT DOCUMENTS

| | | | |
|---|---|---|---|
| 226549 | 6/1987 | European Pat. Off. | 437/918 |
| 3634850 | 4/1987 | Fed. Rep. of Germany | 437/918 |
| 54-11687 | 1/1979 | Japan | 437/47 |
| 57-94562 | 11/1982 | Japan | 437/57 |
| 58-009587 | 2/1983 | Japan | 437/60 |
| 83009587 | 2/1983 | Japan | 437/918 |
| 62-04159 | 5/1987 | Japan | 437/57 |

OTHER PUBLICATIONS

"Titanium Disilicide Self-Aligned Source/Drain+-Gate Technology", Lau et al, IEDM 82 1982.
"Design and Characteristics of a Lightly Doped Drain (LDD) Device Fabricated with Self-Aligned Titanium Disilicide", Lai et al, IEEE Transactions on Electron Devices, vol. ED-33, No. 3, Mar. 1986.

*Primary Examiner*—George Fourson
*Attorney, Agent, or Firm*—Burns, Doane, Swecker & Mathis

[57] ABSTRACT

In a process according to the present invention, a polysilicon gate electrode and a high resistive polysilicon strip are simultaneously patterned on an active area and on a thick field oxide film, respectively, and the gate electrode and the polysilicon strip are covered with thin silicon oxide films, respectively, then impurities being doped in the active area to form source and drain regions, then the thin silicon oxide film being removed from the gate electrode, then a refractory metal silicide film being formed on the gate electrode, however, the formation of the refractory metal silicide film does not affect the polysilicon strip, because the thin silicon oxide film is left thereon, which results in maintaining the polysilicon strip in the high resistivity and, accordingly, in that the polysilicon strip provides a resistor with a large resistance but occupies a small amount of area.

4 Claims, 9 Drawing Sheets

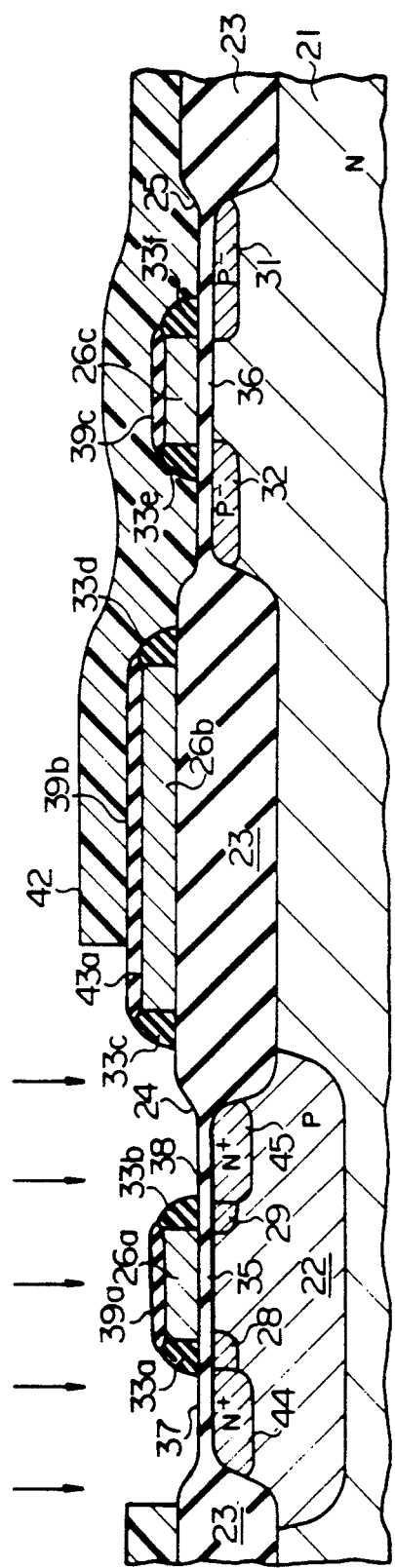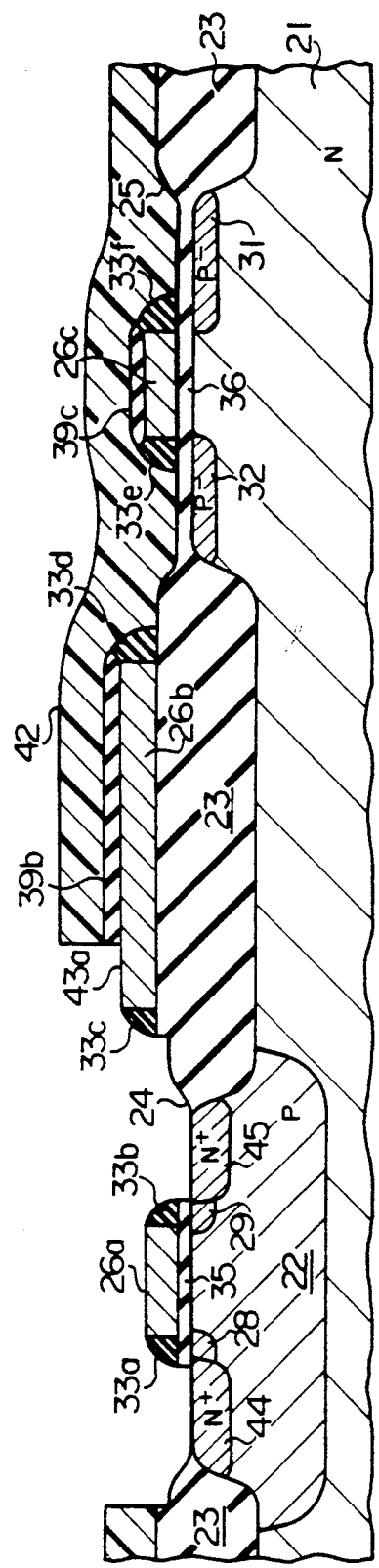

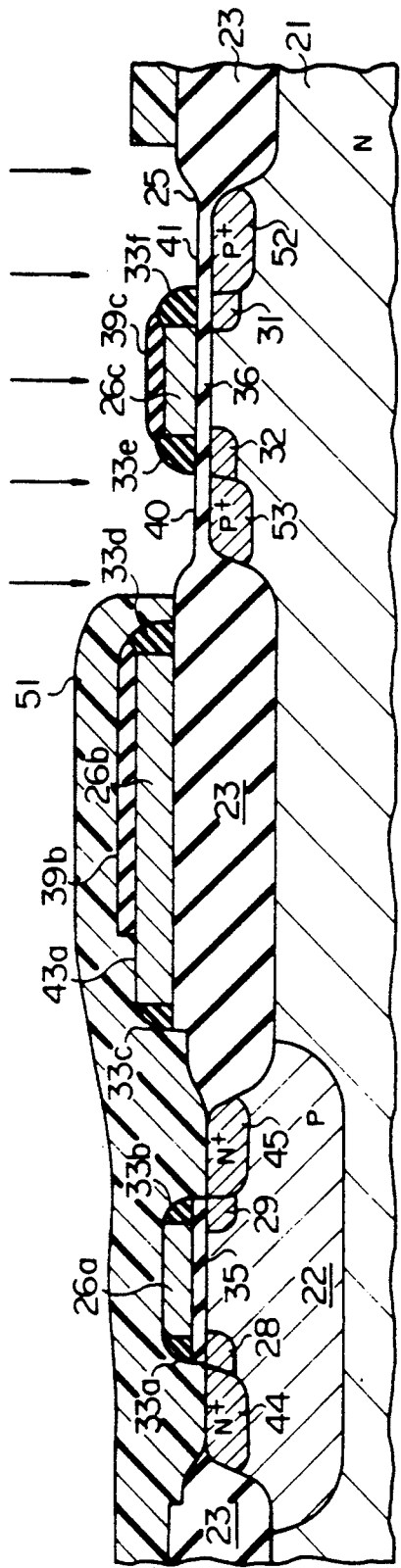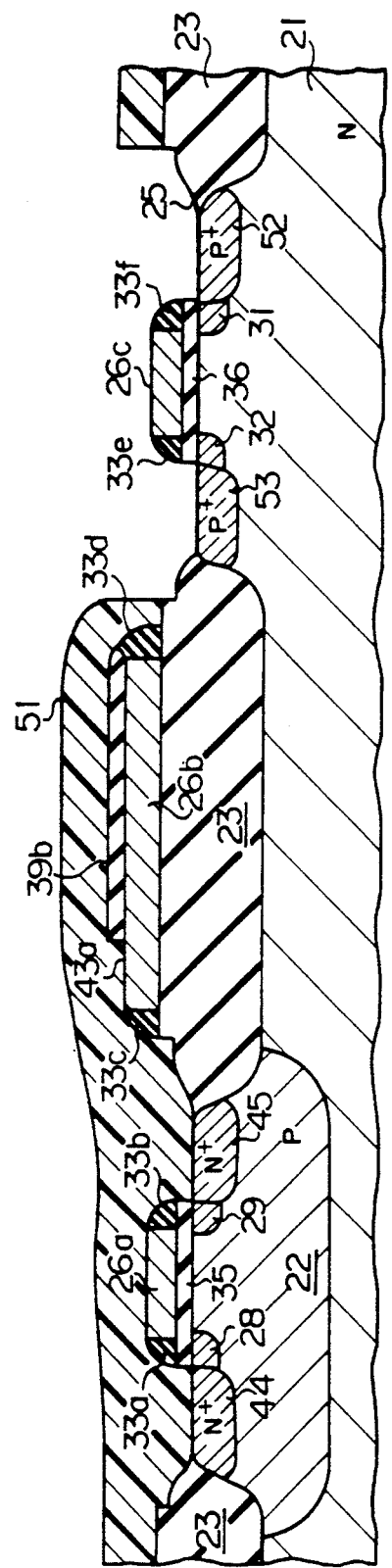

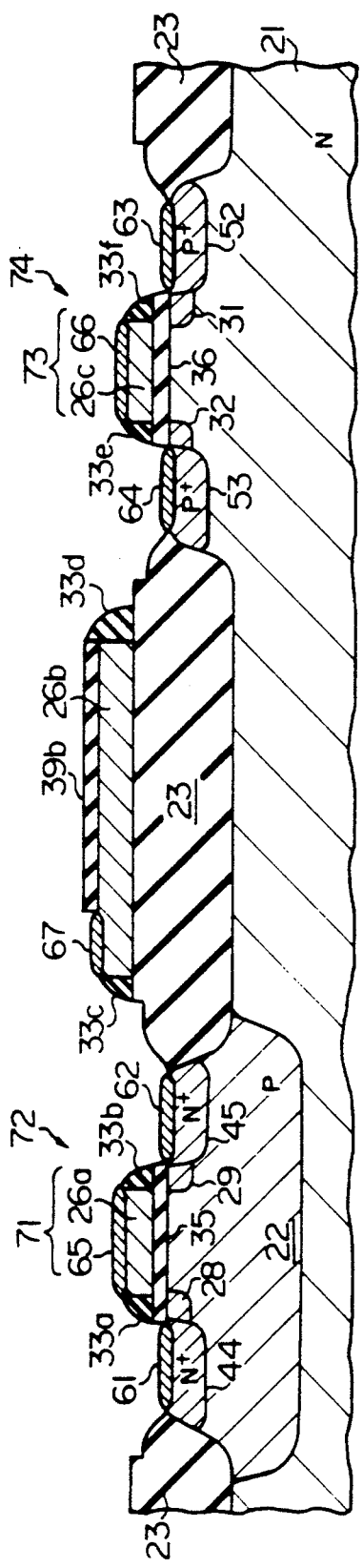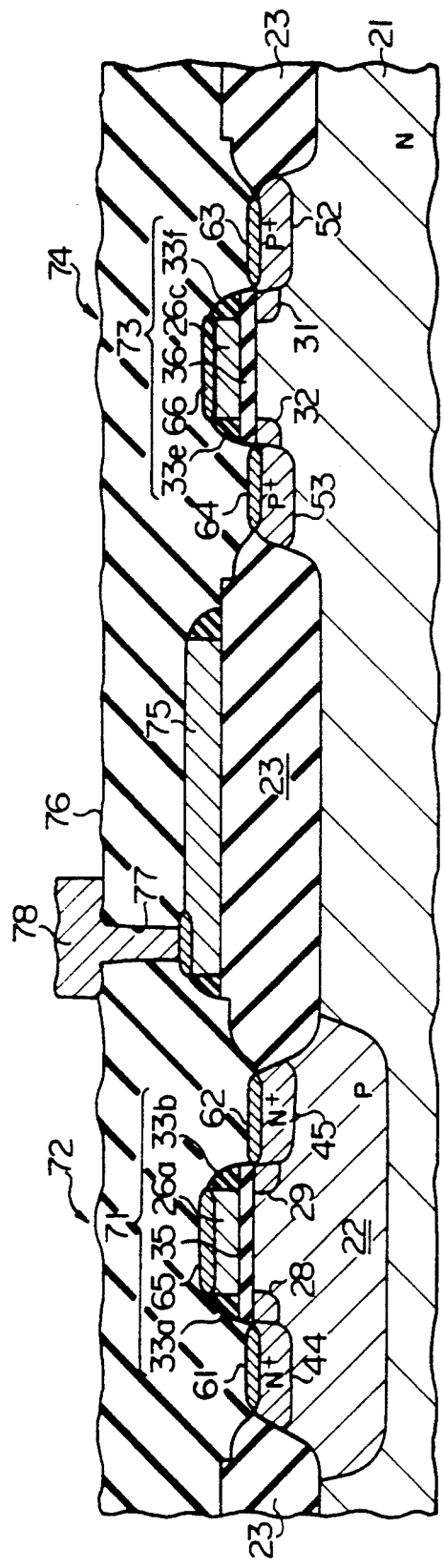

ID CIRCUIT HAVING CONDUCTIVE
PROCESS OF FABRICATING SEMICONDUCTOR INTEGRATED CIRCUIT HAVING CONDUCTIVE STRIPS USED AS RESISTOR AND GATE ELECTRODE OF COMPONENT TRANSISTOR

This application is a continuation, of application Ser. No. 07/441,911, filed Nov. 28, 1989, now abandoned.

FIELD OF THE INVENTION

This invention relates to a process of fabricating a semiconductor integrated circuit and, more particularly, to a process of simultaneously fabricating conductive strips providing a resistor and a gate electrode of a component field effect transistor.

BACKGROUND OF THE INVENTION

In the integrated circuit device are fabricated a large number of circuit component elements which are coupled by a conductive pattern so that a predetermined function or functions are achieved in cooperation of the component elements, however, some of the circuit component elements such as, for example, resistors are implemented by the conductive pattern per se.

A typical example of this sort of arrangement is illustrated in FIG. 1. Reference numeral 1 designates a lightly doped p-type single crystalline silicon substrate, and a thick field oxide film 2 is grown on the silicon substrate 1, defining an active area where a component field effect transistor 3 is fabricated. The component field effect transistor 3 has a lightly-doped drain structure (which has been abbreviated as "LDD-structure"), and largely comprises heavily doped n-type source and drain regions 4 and 5, a gate structure 6 formed over that area between the heavily doped n-type source and drain regions 4 and 5, and lightly-doped n-type source and drain regions 7 and 8 extending from the heavily doped n-type source and drain regions 4 and 5. The gate structure is of a self-aligned silicide structure, and largely comprises a thin gate oxide film 9, a multiple-level gate electrode consisting of a lower polysilicon film 10 and an upper refractory metal silicide film 11, and side spacers 12 and 13 provided on both sides of the lower polysilicon film 10. The heavily doped n-type source and drain regions 4 and 5 are overlain by refractory metal silicide films 14 and 15, respectively, and the refractory metal silicide films 11, 14 and 15 aims at improvement in conductivity.

On the thick field oxide film 2 is formed an interconnection which also has a multiple-level structure. Namely, a lower polysilicon film 16 is directly formed on the thick field oxide film 2, and is overlain by a refractory metal silicide film 17. Side spacers 18 and 19 are provided on both sides of the lower polysilicon film 16, and the interconnection is merged into the gate structure 6. The interconnection is adapted to provide a large resistance and serves as a resistor 20. Thus, the polysilicon strip is partially used as the resistor 20 and partially provides the gate structure 6.

The process of fabricating the prior art structure starts with preparation of the lightly doped p-type single crystalline silicon substrate 1. The thick field oxide film 2 is thermally grown on the substrate 1 by using the localized oxidation of silicon technique, and the substrate 1 is placed in a high temperature ambience again to grow a thin silicon oxide film.

On the thin silicon oxide film is deposited a polycrystalline silicon film which is, then, patterned by using the lithographic techniques. Using the polysilicon strip thus patterned as an ion-implantation mask, n-type impurity atoms are introduced into the active area defined in the substrate 1 so that the lightly doped source and drain regions 7 and 8 are formed in the substrate 1. With the n-type impurity atoms, the polysilicon strip is lowered in resistivity.

A silicon oxide film is deposited over the entire surface of the structure, and is anisotropically etched away to form the side spacers 12, 13, 18 and 19. The thin silicon oxide film is simultaneously removed in the anisotropic etching process, and the active area between the thick field oxide film 2 and the side spacers 12 and 13 is exposed. The thin silicon oxide film left on the active area serves as the thin gate oxide film 9.

N-type impurity atoms are implanted into the exposed active area so that the heavily doped source and drain regions 4 and 5 are formed in the active area. The n-type impurity atoms are also introduced in the polysilicon strip, and the polysilicon strip is further improved in the resistivity. After the formation of the heavily doped source and drain regions 4 and 5, a conductive refractory metal is deposited over the entire surface of the structure, and the substrate is placed in a high temperature ambience. In the high temperature ambience, the conductive refractory metal reacts on the polysilicon and the single crystalline silicon, and is converted into a refractory metal silicide film. The non-reactive or residual refractory metal is etched away, and, accordingly, the refractory metal silicide films 11, 14, 15 and 17 are formed on the lower polysilicon film 10, the heavily doped source and drain regions 4 and 5 and the lower polysilicon film 16, respectively.

However, a problem is encountered in the prior art integrated circuit in that the resistor 20 occupies a large amount of area. This is because of the fact that the polysilicon strip is exposed to the ion implantation twice and overlain by the refractory metal silicide. The more impurity atoms a polysilicon strip contains, the lower resistivity it provides. Moreover, a refractory metal silicide is much smaller in resistivity than a polysilicon. The low resistive interconnection should be prolonged to provide an amount of large resistance, and, for this reason, the resistor 20 occupies a large amount of the real estate. This deteriorates the integration density, or the chip size is enlarged so as to fabricate all of the component elements.

A mask layer may provide a solution of this problem. In detail, if a photoresist mask layer is provided on the entire surface of the structure and exposes the upper refractory metal silicide film 17, the upper refractory metal silicide film 17 is selectively removed from the lower polysilicon film. However, this solution makes the process sequence complex and, accordingly, increases the production cost of the integrated circuit. Moreover, a mask pattern is liable to be improperly transferred to the photoresist film, and the resist image tends to deviate from the mask image. This results in fluctuation of resistance due to difference in geometry. The fluctuation may not be material to a digital application, however, it is serious to an analog application. The improper image transfer requests a tolerance, and, for this reason, the occupation area tends to be increased.

SUMMARY OF THE INVENTION

It is therefore an important object of the present invention to provide a process through which a semiconductor integrated circuit is fabricated on a relatively small occupation area.

It is also an important object of the present invention to provide a process the sequence of which is less complex to simultaneously form multiple-level conductive structures used as a resistor and a gate structure of a component field effect transistor.

It is another important object of the present invention to provide a process which can exactly adjust the resistance of a conductive strip and is, accordingly, preferable to fabricate an analog circuit.

To accomplish these objects, the present invention proposes to cover a polysilicon resistor with an oxide film during producing silicide films.

In accordance with the present invention, there is provided a process of integrating a circuit on a semiconductor substrate, comprising the steps of: a) preparing a semiconductor substrate of a first conductivity type; b) defining an active area by a thick field oxide film; c) forming a first oxide film on the active area; d) forming a gate electrode of a lightly doped polysilicon on the first silicon oxide film and a resistor of the lightly doped polysilicon on the thick field oxide film; e) forming lightly doped source and drain regions of a second conductivity type opposite to the first conductivity type in a self aligned manner with the gate electrode; f) covering the gate electrode and the resistor with second and third oxide films, respectively; g) forming heavily doped source and drain regions of the second conductivity type partially overlapped with the lightly doped source and drain regions, thereby forming composite source and drain regions in the active area; h) removing the first and second oxide films from the surfaces of the heavily doped source and drain regions and a top surface of the gate electrode, respectively, and leaving the third oxide film on a top surface of the resistor; i) forming conductive refractory metal silicide films on the respective surfaces of the heavily doped source and drain regions and the top surface of the gate electrode, respectively; j) removing the third oxide film from the top surface of the resistor; and k) providing interconnections so as to complete the circuit.

BRIEF DESCRIPTION OF THE DRAWINGS

The features and advantages of a process of fabricating a semiconductor integrated circuit according to the present invention will be more clearly understood from the following description taken in conjunction with the accompanying drawings in which:

FIGS. 2A to 2J are cross sectional views showing a process sequence embodying the present invention;

DESCRIPTION OF THE PREFERRED EMBODIMENT

Figure 1:
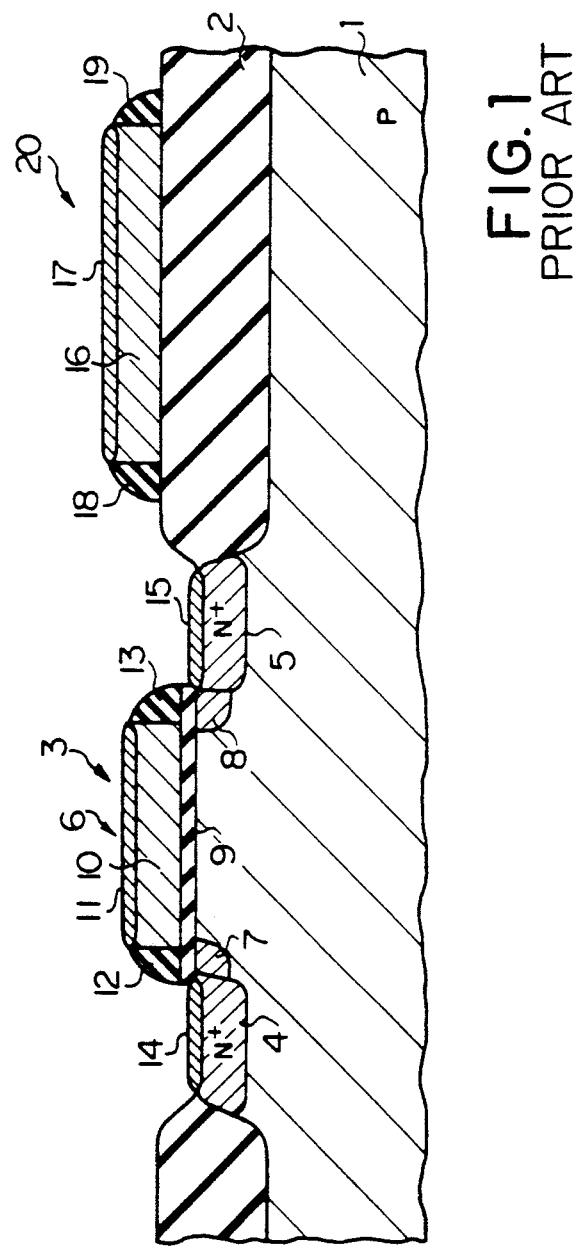
FIG. 1 is a cross sectional view showing the structure of a semiconductor integrated circuit fabricated through a prior art process sequence.
Figure 2A:
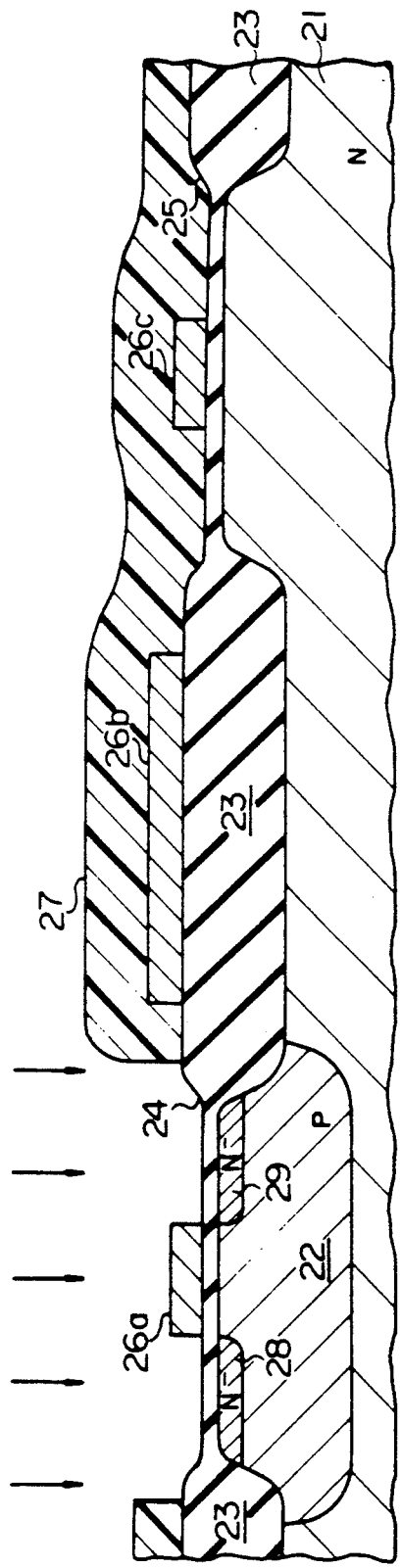

Referring first to FIG. 2A of the drawings, a process according to the present invention starts with preparation of a lightly doped n-type single crystalline silicon substrate 21. P-type impurities such as, for example, boron atoms are selectively doped into the substrate 21 so that a p-well 22 is formed in the surface portion of the substrate 21. A thick field oxide film 23 is thermally grown on the surface portion by using the localized oxidation of silicon technique, and active areas 24 and 25 are defined by the thick field oxide film 23. The single crystalline silicon substrate 21 is, then, oxidized in a high temperature ambience so that thin silicon oxide films are grown on the active areas 24 and 25, respectively.

On the entire surface of the structure is deposited a polysilicon film which is etched and patterned to form polysilicon strips 26a, 26band 26c. In this instance, the polysilicon film is deposited by using a chemical vapor deposition technique, and the polysilicon is doped with n-type impurities by in-situ doping. However, a post-deposition doping may be carried out in another implementation. The amount of the dopant is adjusted to provide a certain resistivity which allows the polysilicon strip 26b to achieve a predetermined resistance considering the geometry thereof. The polysilicon strip 26b extends on the thick field oxide film 23, and the polysilicon strips 26a an 26c are formed on the thin silicon oxide films in the active areas 24 and 25.

After the formation of the polysilicon strips 26a, 26b and 26c, a photoresist solution is dropped onto the structure, and is spread over the entire surface. The photoresist film is, then, patterned by using lithographic techniques so that a patterned photoresist layer 27 is formed on the substrate 21 and exposes the active area 24. N-type impurities such as, for example, phosphorus atoms or arsenic atoms are implanted into the active area 24 in a self-aligned fashion, and, accordingly, lightly doped source and drain regions 28 and 29 are formed under those areas on both sides of the polysilicon strip 26a. The polysilicon strip 26a in the active area 24 is exposed to the ion implantation, and the conductivity thereof is enhanced by the implanted n-type impurities. However, the polysilicon strip 26b on the thick field oxide film 23 is free from the ion implantation, and, for this reason, the resistivity thereof remains in the aforementioned certain value. The resultant structure of this stage is illustrated in FIG. 2A.

Figure 2B:
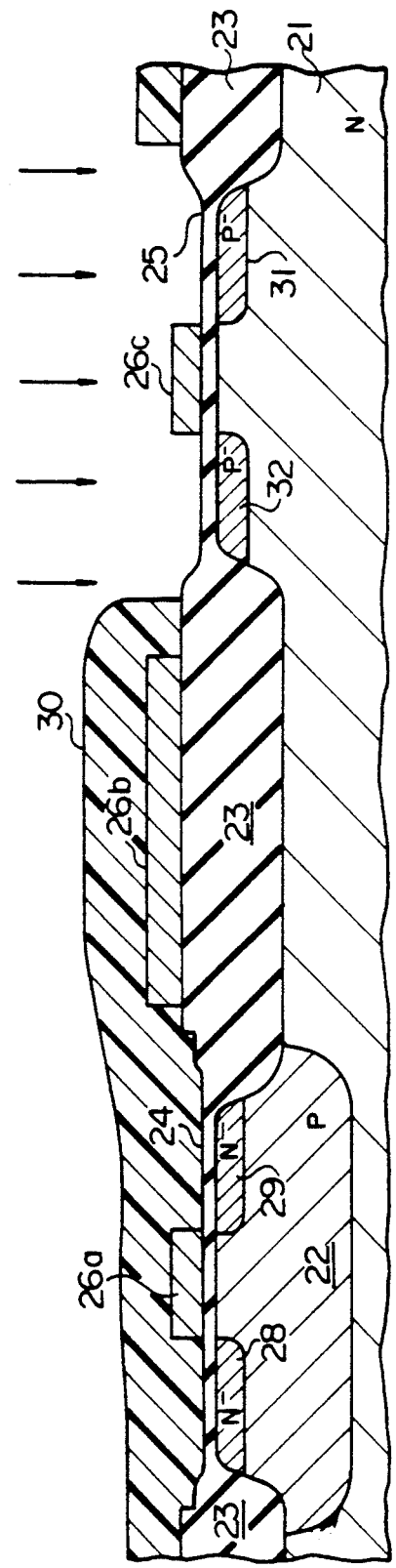

The patterned photoresist layer 27 is stripped off, and a fresh photoresist solution is spun onto the entire surface of the structure. The photoresist film is patterned to form a photoresist layer 30 which covers the active area 24 and the thick field oxide film 23, but exposes the active area 25. Using the patterned photoresist layer 30 and the polysilicon strip 26c in the active area 25 as an ion implantation mask, p-type impurities such as, for example, boron atoms are implanted into the active area 25 to form lightly doped p-type source and drain regions 31 and 32. The polysilicon strip 26b on the thick field oxide film 23 is free from the ion implantation again so that the effective impurity concentration is constant over the doping process. Thus, the impurity concentration and, accordingly, the resistivity are decided by the in-situ doping or the post-deposition doping only, and the patterned photoresist layers 27 and 30 are necessary to form the impurity regions different in the conductivity type. For this reason, the resistivity of the polysilicon strip 26b is precisely adjusted without making the process sequence complex. In other words, if the polysilicon strip 26b on the thick field oxide film 23 is exposed to the ion implantations, the final effective impurity concentration is not controllable, and, accordingly, the resistance is much liable to deviate from the predetermined value. However, the resistance of the polysilicon strip 26b on the thick field oxide film 23 is precisely adjustable by virtue of the patterned photoresist layers 27 and 30. After the formation of the lightly doped source and drain regions 31 and 32, the patterned photoresist layer 30 is removed from the surface, and the resultant structure of this stage is illustrated in FIG. 2B.

Figure 2C:
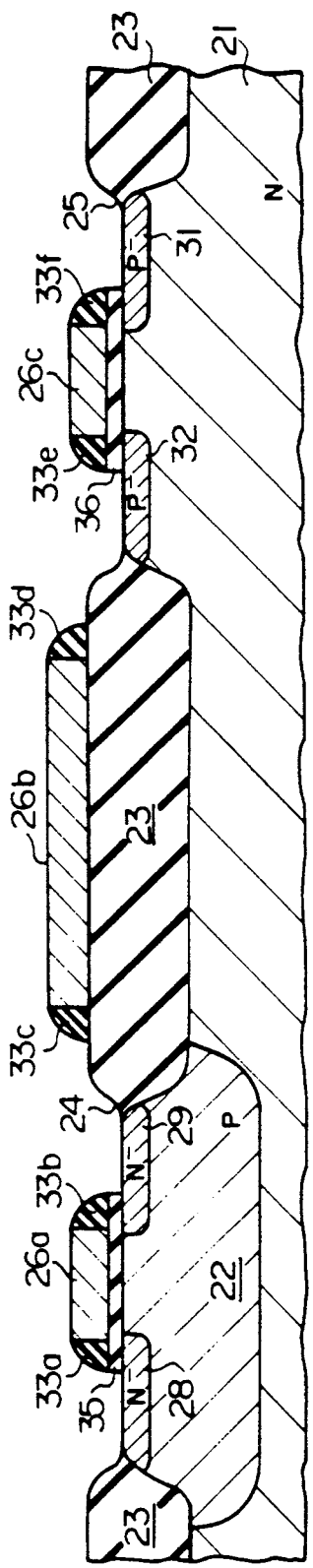

The subsequent step is deposition of a silicon oxide film, and a chemical vapor deposition technique is applicable to this step. The silicon oxide film thus deposited is anisotropically etched to form side spacers 33a, 33b, 33c, 33d, 33e and 33f, and the thin silicon oxide films on the active areas are selectively removed from the active areas 24 and 25 to form gate oxide films 35 and 36, respectively. The resultant structure of this stage is illustrated in FIG. 2C.

Figure 2D:
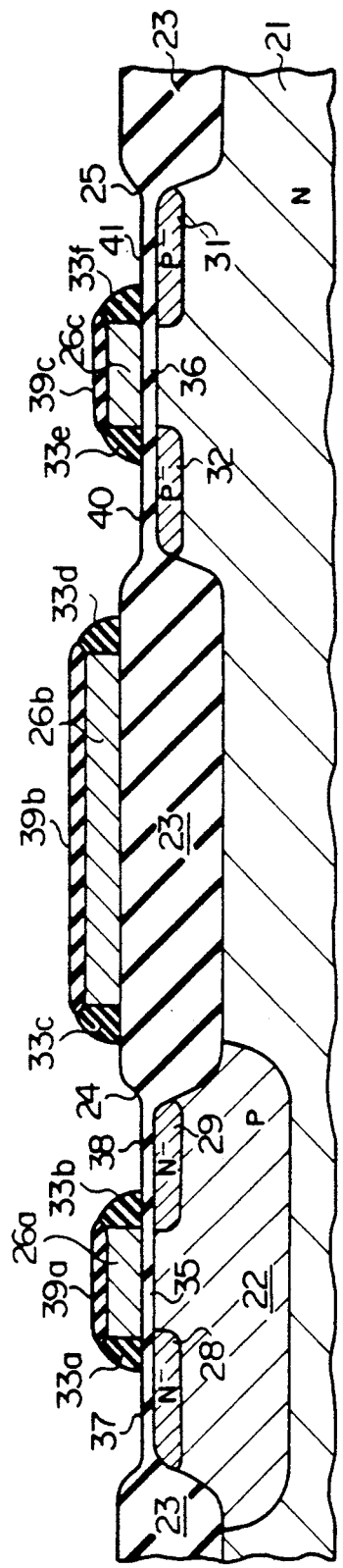

The resultant structure is placed in an oxidation ambience, and thin silicon oxide films 37, 38, 39a, 39b, 39c, 40 and 41 cover the lightly doped source and drain regions 28, 29, 31 and 32 as well as the top surface of the polysilicon strips 26a, 26b and 26c as shown in FIG. 2D.

Figure 3:
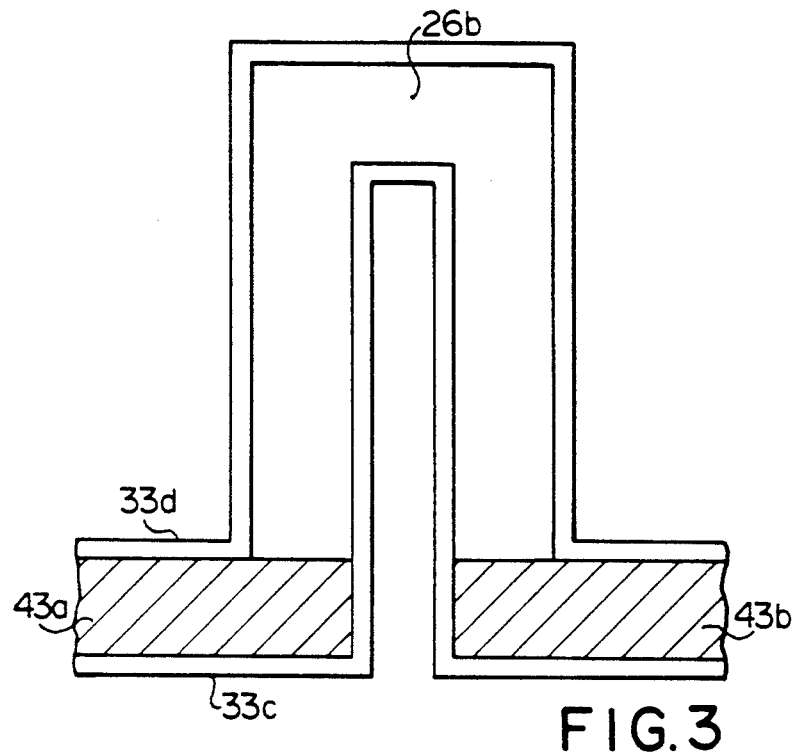
FIG. 3 is a plan view showing the layout of a resistor formed by using the process shown in FIGS. 2A to 2J.

A photoresist solution is dropped on the surface of the structure, and is spread over the entire surface to form a photoresist film. The photoresist film is, then, patterned by using the lithographic techniques so that a photoresist layer 42 exposes the active area 24 and a part 43a of the polysilicon strip 26b on the thick field oxide film 23. The part 43a of the polysilicon strip 26 provides a contact area where an interconnection is brought into contact in a later stage. N-type impurities are heavily introduced into the active area 24 and the exposed polysilicon strip 26 through the thin silicon oxide films 37 to 39 by using the ion implantation technique followed by a drive-in process, and the heavily doped source and drain regions 44 and 45 are formed in the active area 24 in a partially overlapping manner with the lightly doped source and drain regions 28 and 29, respectively. Thus, the LDD (Lightly-Doped Drain) structure is fabricated in the active area 24, and the composite drain region is hardly broken down by virtue of the lightly doped region 28 or 29. This improves the withstand voltage of the p-n junction between the composite drain region and the substrate 21. The n-type impurities are also introduced in the exposed polysilicon strip 26b, and these n-type impurities decrease the resistivity of the part 43a of the polysilicon strip 26b. The contact area 43a thus increased in the impurity concentration is capable of formation of an ohmic contact. The layout of the polysilicon strip 26b and the arrangement of the contact areas 43a and 43b will be seen from FIG. 3 of the drawings.

However, most of the polysilicon strip 26 on the thick field oxide film 23 is covered with the patterned photoresist layer 42 so that variation in the resistivity is negligible, and, accordingly, the resistance is deemed to be constant. Thus, the patterned photoresist layer 42 is conducive to keeping the resistivity of the polysilicon strip constant. The resultant structure of this stage is illustrated in FIG. 2E.

After the formation of the composite source and drain regions, the silicon oxide films 37, 38 and 39 are removed through an etching process so that the n-type impurity regions 44 and 45 as well as the polysilicon strip 26 on the active area 24 are exposed as will be understood from FIG. 2F. The etching is of either dry or wet process.

After the patterned photoresist layer 42 is stripped off, a fresh photoresist solution is spun onto the entire surface of the structure, and the photoresist film thus formed is patterned to provide a photoresist layer 51 exposing the active area 25. P-type impurities are heavily doped into the active area 25 followed by a drive-in process so that heavily doped source and drain regions 52 and 53 are formed in a self-aligned manner. The heavily doped source and drain regions 52 and 53 are partially overlapped with the lightly doped source and drain regions 31 and 32, respectively, and the LDD or lightly-doped drain structure is also achieved in the active ares 25. While implanting the p-type impurities, the patterned photoresist layer 51 prevents the polysilicon strips 26b and 26c from the p-type impurities, and, accordingly, no fluctuation takes place in the resistivity of the polysilicon strip 26b. The resultant structure of this stage is illustrated in FIG. 2G.

The thin silicon oxide films 40, 41 and 39c are etched away to expose the heavily doped source and drain regions 52 and 53 as well as the polysilicon strip 26c on the active area 25. The etching technique is of the dry process or the wet process, and the resultant structure is shown in FIG. 2H.

When the patterned photoresist layer 51 is stripped off, the polysilicon strips 26a and 26c on the active areas 24 and 25 are exposed, however, the polysilicon strip 26b on the thick field oxide film 23 is covered with the thin silicon oxide film 39b except for the contact areas 43a and 43b. No thin silicon oxide film covers the heavily doped source and drain regions 44, 45, 52 and 53, and the surfaces thereof are exposed. A refractory metal such as titanium is deposited over the entire surface of the structure, and the substrate 21 is placed in a high temperature ambience so that the refractory metal reacts with the polysilicon and the single crystalline silicon. Thus, refractory metal silicide films 61, 62, 63, 64, 65, 66 and 67 are formed on the heavily doped source and drain regions 44, 45, 52, and 53, the exposed polysilicon strip 26, respectively. After the formation of the refractory metal silicide films 61 to 67, the residual refractory metal is removed from the structure. Since the thin silicon oxide film 39 has been left on the polysilicon strip 26b on the thick field oxide film 23, no refractory metal silicide overlies the polysilicon strip 26b serving as a resistor 75 with a large amount of resistance, and, for this reason, the silicide process does not affect the resistivity of the polysilicon strip 26b on the thick field oxide film 23. The thin gate oxide film 35, the side spacers 33a and 33b, the polysilicon film 26a and the refractory metal silicide film 65 form in combination a multiple-level gate structure 71, and the multiple-level gate structure 71 and the source and drain regions 28, 29, 44 and 45 as a whole constitute an n-channel MOS type field effect transistor 72. Similarly, the thin gate oxide film 36, the side spacers 33e and 33f, the polysilicon strip 26c and the refractory metal silicide film 66 form in combination a multiple-level gate structure 73, and the multiple-level gate structure 73 and the source and drain regions 31, 32, 52 and 53 as a whole constitute a p-channel MOS type field effect transistor. Moreover, the polysilicon strip 26 without any refractory metal silicide film provides the resistor 75. The resultant structure of this stage is shown in FIG. 2I.

After the thin silicon oxide film 39b is removed, a silicon oxide is deposited by using the chemical vapor deposition technique so that an inter-level insulating layer 76 covers the entire surface of the structure. A contact window 77 is formed in the inter-level insulating layer 76, and an aluminum alloy is deposited over the entire surface. The aluminum alloy is patterned to form an interconnection 78. Although the gate structures 71 and 73 are respectively coupled to interconnections, FIG. 2J does not show the interconnections. The resultant structure is shown in FIG. 2J.

Figure 4:
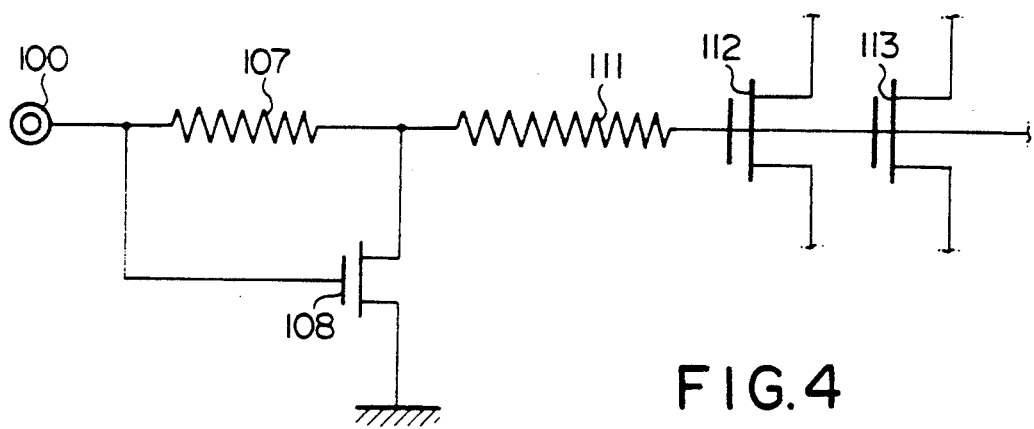
FIG. 4 is a circuit diagram showing the arrangement of an input protection circuit to which a process according to the present invention appertains.
Figure 5:
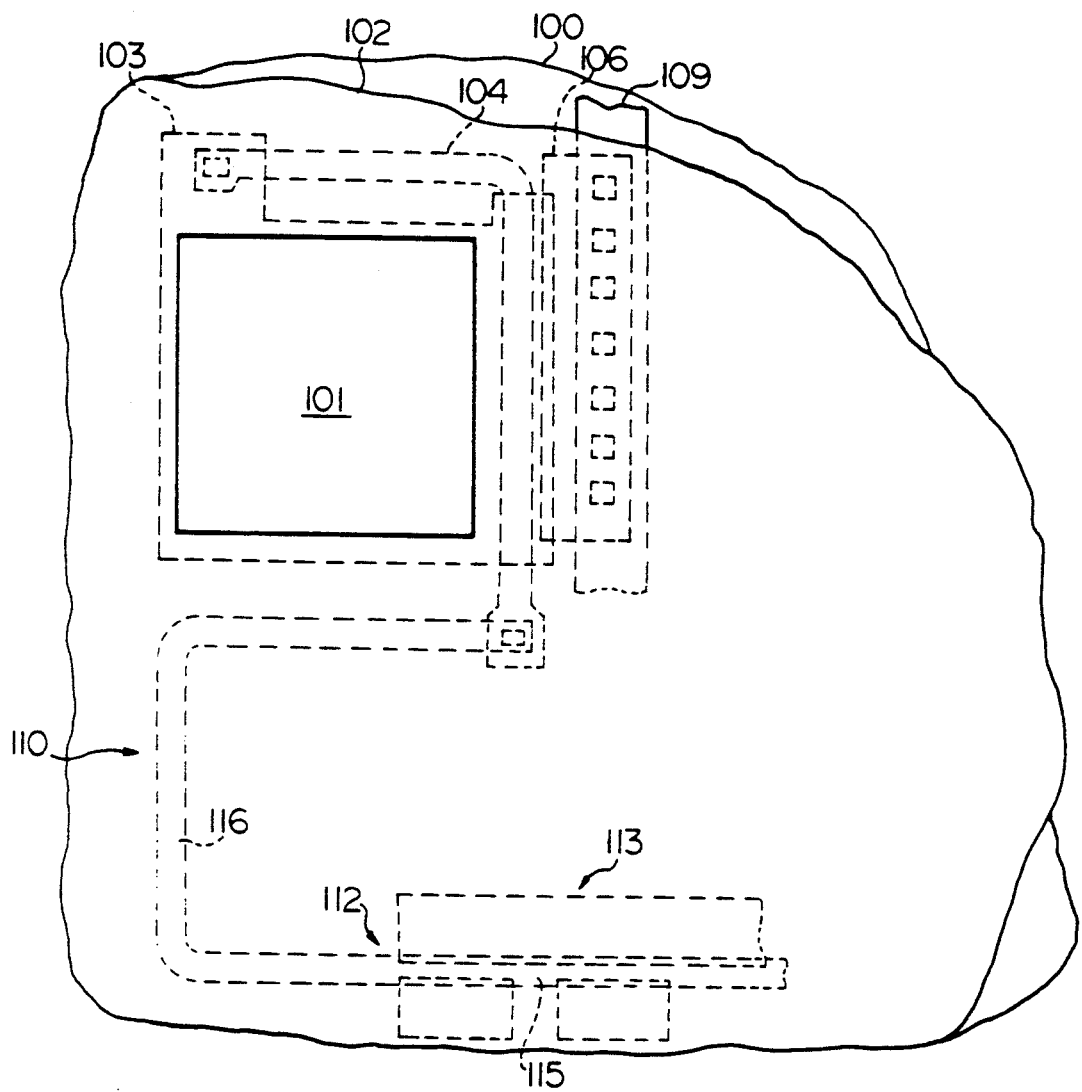
FIG. 5 is a plan view showing the layout of the input protection circuit shown in FIG. 4.

Turning to FIGS. 4 and 5 of the drawings, there is shown an input protection circuit which is integrated on a semiconductor substrate 100 through a process sequence according to the present invention. In FIGS. 4 and 5, reference numeral 101 designates a bonding pad coupled to a lead frame via. an aluminum bonding wire (not shown), and the bonding pad 101 is formed on a thick field oxide film and partially covered with a passivation film 102. The bonding pad 101 has a lug portion 103 coupled to a lightly doped n-type impurity region 104 formed in the p-type semiconductor substrate 100, and the n-type impurity region 104 has a generally inversed-L shape. Another n-type impurity region 106 is formed in the semiconductor substrate 100 in a spacing relationship with a part of the impurity region 104. The thick field oxide film extends over that area between the impurity regions 104 and 106, and the bonding pad 100 also extends over the area. The lightly doped n-type impurity region 104 provides a resistor 107 and forms a drain region of a protective transistor 108. The bonding pad 100 provides a gate electrode of the protective transistor 108, and the thick field oxide film serves as a gate oxide film. The n-type impurity region 106 is coupled to a ground line 109 so that the protective transistor 108 turns on to discharge an excess high voltage level due to, for example, a surge current, however, the protective transistor 108 remains in the off state in so far as a signal swings its voltage level in a predetermined range.

The lightly doped n-type impurity region 104 is further coupled to a multi-level conductive wiring 110 extending over the thick filed oxide film, and the multi-level conductive wiring 110 consists of a lower polycrystalline silicon film and an upper refractory metal silicide film. The multi-level conductive wiring 110 partially provides a resistor 111, and is shared with the respective gate electrodes of field effect transistors 112 and 113. Then, the multi-level conductive wiring 110 should be partially high-resistive for the resistor 111 and partially low-resistive for the gate electrodes of the component transistors.

The input protective circuit thus arranged is fabricated through a process sequence similar to that illustrated in FIGS. 2A to 2J except for the ion implantation stages. Namely, no ion implantation is carried out with p-type impurities, however, the polysilicon strip is covered with a thin silicon oxide film similar to the stage shown in FIG. 2D. The thin silicon oxide film is partially removed from a part 115 of the polysilicon strip after the ion implantation for the heavily doped source and drain regions, however, the thin silicon oxide film is left on the other part 116 of the polysilicon strip 110 for the resistor 111. The formation of the refractory metal silicide films are, then, carried out to enhance the conductivity of the gate electrodes of the component transistors, however, the thin silicon oxide film prevents the other portion 116 of the polysilicon strip 110 from the silicide process. Thus, the other part 116 is large in resistivity, and, for this reason, the occupation area is relatively small.

Figure 6:
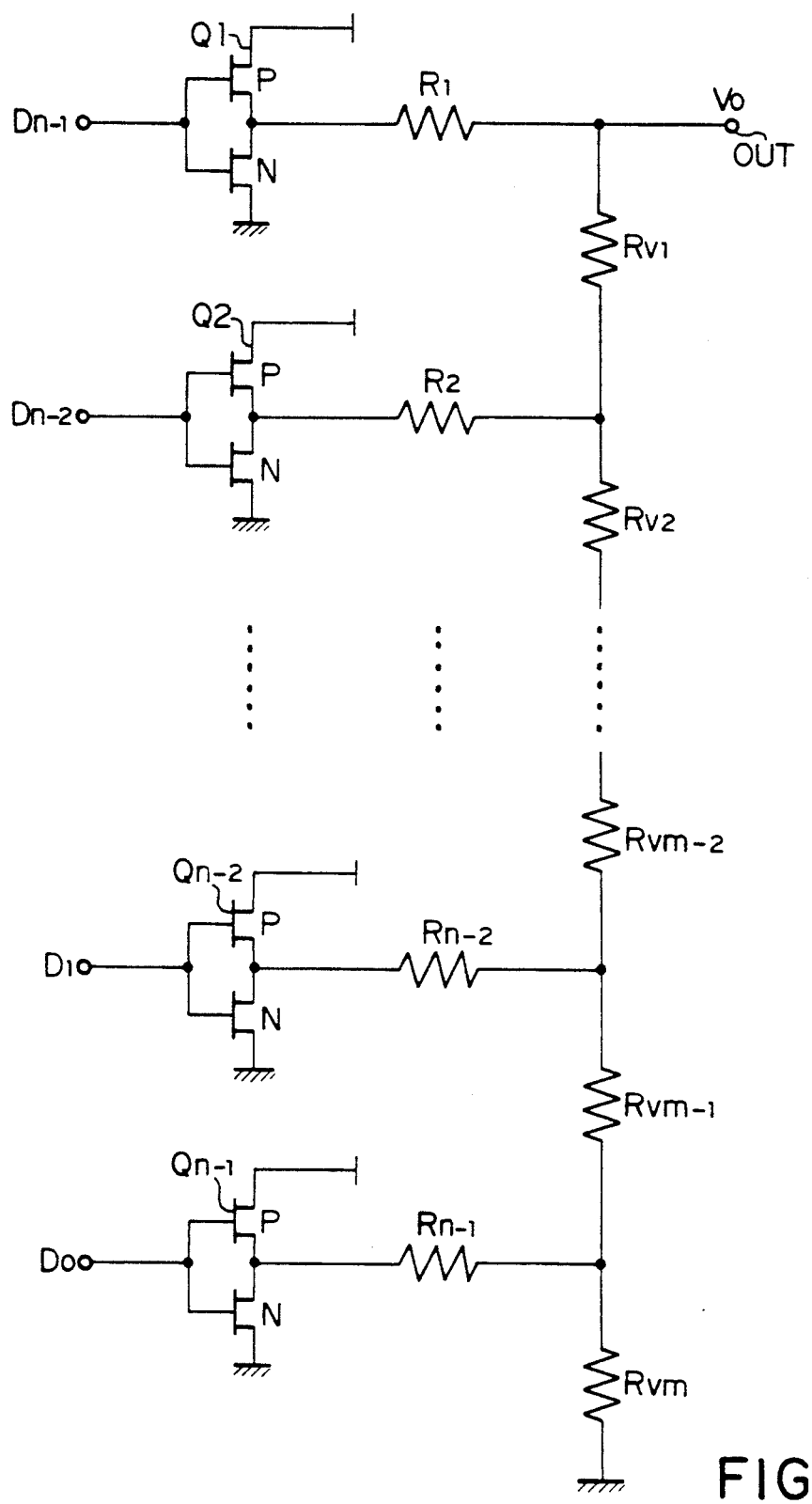
FIG. 6 is a circuit diagram showing a digital-to-analog converting circuit according to the present invention.

The present invention is applicable to a digital-to-analog converting circuit shown in FIG. 6. The digital-to-analog converting circuit shown in FIG. 6 is supplied with a multi-bit input signal D0, D1, Dn−2 and Dn−1, and the bits of the multi-bit input signal D0 to Dn−1 are transferred to complementary inverter circuits Q1, Q2, ..., Qn−2 and Qn−1, and the complementary inverter circuits Q1 to Qn−1 are associated with resistors R1, R2, Rn−2 and Rn−1. A series combination of resistors Rv1, Rv2, ..., Rvm−2, Rvm−1 and Rvm is coupled between an output node OUT and a ground node, and each of the resistors R1, R2, Rn−2 or Rn−1 is coupled between the two adjacent resistors of the series combination. The resistors R1, R2, ..., Rn−2 and Rn−1 are as large in resistance as the resistor Rvm, however, the resistance of each of the resistors Rv1, Rv2, ..., Rvm−2 or Rvm−1 is a half of that of the resistor Rvm.

The voltage level V0 at the output node OUT depends on the bit string of the input signal, and is given by the follow equation:

$$V0 = (Vs/3)(Dn-1 \times 2^0 + Dn-2 \times 2^{-1} + \ldots + D1 \times 2^{-(n-2)} + D0 \times 2^{-(n-1)})$$

where Vs is a reference voltage level. The resistance of each resistor is selected to be much larger than the channel resistance of the component transistor of each complementary inverter circuit, and the accuracy of the digital-to-analog converting circuit is affected by the difference between a target resistance and an actual resistance of each resistor. According to the present invention, the resistance is precisely adjusted to the target value, and, for this reason, a high accuracy is achieved by the digital-to-analog converting circuit.

As will be understood from the foregoing description, since the thin silicon oxide film protects the polysilicon strip from the silicide process, the resistor occupies a relatively small amount of the real estate without sacrifice of the simple process sequence.

Although particular embodiment of the present invention have been shown and described, it will be obvious to those skilled in the art that various changes and modifications may be made without departing from the spirit and scope of the present invention.

What is claimed is:

1. A process of integrating a circuit on a semiconductor substrate, comprising the steps of:
   a) preparing a semiconductor substrate of a first conductivity type;
   b) providing a thick field oxide film to define a first active area of a second conductivity type opposite to said first conductivity type and a second active area of said first conductivity type;
   c) forming first oxide films on said first and second active areas;
   d) forming first and second gate electrodes of lightly doped polysilicon on said first oxide films and a resistor of the lightly doped polysilicon on said thick field oxide film;

e) forming lightly doped source and drain regions of said first conductivity type in a self aligned manner with said first gate electrode;

f) forming lightly doped source and drain regions of said second conductivity type in a self aligned manner with said second gate electrode;

g) covering said first and second gate electrodes with second oxide films and said resistor with a third oxide film;

h) forming a first patterned photoresist layer for covering a part of said third oxide film on said resistor and said second active region and exposing said first active area and the rest of said third oxide film on said resistor;

i) forming heavily doped source and drain regions of said first conductivity type partially overlapped with said lightly doped source and drain regions in said first active area by using an ion implantation, thereby forming composite source and drain regions in said first active area;

j) removing said first oxide film, said second oxide film and said rest of said third oxide film from surfaces of said heavily doped source and drain regions in said first active area, a surface of said gate electrode and a portion of said resistor to thereby expose said portion of said resistor corresponding to said rest of said third oxide, respectively, and leaving said part of said third oxide film on a surface of said resistor;

k) removing said first patterned photoresist layer;

l) forming a second patterned photoresist layer covering said part of said third oxide film on said resistor, said portion of said resistor and said first active area, and exposing said second active area;

m) forming heavily doped source and drain regions of said second conductivity type partially overlapped with said lightly doped source and drain regions in said second active area by using an ion implantation, thereby forming composite source and drain regions in said second active area;

n) removing said first and second oxide films from surfaces of said heavily doped source and drain regions in said second active area and a surface of said second gate electrode, respectively, and leaving said third oxide film on the surface of said resistor;

o) removing said second patterned photoresist layer;

p) forming silicide films on the exposed source and drain regions, surfaces of said first and second gate electrodes and said portion of said resistor; and q) providing interconnections for said circuit.

2. A process for integrating a circuit on a semiconductor substrate, comprising the steps of:

a) preparing a semiconductor substrate of a first conductivity type;

b) defining first and second active areas by a thick field oxide film;

c) forming first oxide films on said first and second active areas;

d) forming first and second gate electrodes of lightly doped polysilicon on said first oxide films and a resistor of the lightly doped polysilicon on said thick field oxide film;

e) covering said first and second gate electrodes with second oxide films and said resistor with a third oxide film;

f) forming a first patterned photoresist layer covering a part of said third oxide film on said resistor and said second active region and exposing said first active area and the rest of said third oxide film on said resistor;

g) implanting first conductivity type ions into said first active area with said first gate electrode to thereby provide doped source and drain regions of said first conductivity type in said first active area;

h) removing said first oxide film, said second oxide film and said rest of said third oxide film from surfaces of said doped source and drain regions in said first active area, a surface of said first gate electrode and a portion of said resistor to thereby expose said portion of said resistor corresponding to said rest of said third oxide respectively, and leaving said part of said third oxide film on a surface of said resistor;

i) removing said first patterned photoresist layer;

j) forming a second patterned photoresist layer for covering said part of said third oxide film on said resistor, said portion of said resistor and said first active area, and exposing said second active area;

k) implanting second conductivity type ions into said second active area with said second gate electrode to thereby provide doped source and drain regions of said second conductivity type;

l) removing said first and second oxide films from surfaces of said doped source and drain regions in said second active area and a surface of said second gate electrode, respectively, and leaving said third oxide film on the surface of said resistor;

m) removing said second patterned photoresist layer;

n) forming silicide films on the exposed source and drain regions, surfaces of said first and second gate electrodes and said portion of said resistor; and o) providing interconnections for said circuit.

3. A process as set forth in claim 1, in which said step (e) comprises the sub-step of doping the second active area with impurities of said second conductivity type.

4. A process as set forth in claim 1, in which said step (g) comprises the sub-steps of:

g-1) depositing a fourth oxide film over said first and second gate electrodes and said resistor;

g-2) anisotropically etching said fourth oxide film to form side spacers on both sides of each of said first and second gate electrodes and on both sides of said resistor; and g-3) oxidizing said substrate to form fifth and sixth oxide films on top surfaces of said first and second gate electrodes and said resistor.

* * * * *